United States Patent [19]

Tuan

[11] 4,380,803
[45] Apr. 19, 1983

[54] READ-ONLY/READ-WRITE MEMORY
[75] Inventor: Hsing T. Tuan, Poway, Calif.
[73] Assignee: Burroughs Corporation, Detroit, Mich.
[21] Appl. No.: 233,066
[22] Filed: Feb. 10, 1981
[51] Int. Cl.³ .............................................. G11C 7/00
[52] U.S. Cl. .................................. 365/183; 365/102; 365/149
[58] Field of Search ................ 365/95, 102, 149, 183, 365/228; 307/238.3

[56] References Cited

U.S. PATENT DOCUMENTS 3,755,793 8/1973 Ho et al. ............................ 365/183
3,983,544 9/1976 Dennison et al. ................. 365/149
4,230,954 10/1980 Heller ........................... 365/183 X

*Primary Examiner*—Joseph A. Popek
*Attorney, Agent, or Firm*—Charles J. Fassbender; J. Ronald Richbourg; Kevin R. Peterson

[57] ABSTRACT

An improved read-only/read-write semiconductor memory of the type that includes a semiconductor substrate with dopant atoms of a first conductivity type, a pair of spaced-apart charge storage regions at the surface of the substrate, a bit line at the surface of the substrate spaced apart from the charge storage region, respective MOSFET transistor gate regions at the surface of the substrate between the bit line and the charge storage regions, and a conductor over the storage regions; the improvement comprising dopant atoms of a second conductivity type in one of the storage regions, and dopant atoms of the first conductivity type in the other of the storage regions having a greater doping concentration than is in the body of the substrate; and circuitry for applying a read-write mode voltage to the conductor to permit charge to be stored in both of the storage regions, and for applying a read-only mode voltage to the conductor to permit charge to be stored in the one storage region and simultaneously prevent charge from being stored in the other storage region by there producing a potential barrier.

6 Claims, 8 Drawing Figures

READ-ONLY/READ-WRITE MEMORY

BACKGROUND OF THE INVENTION

This invention relates to the art of integrated circuits, and more particularly to the art of digital semiconductor memories. Basically, a digital semiconductor memory is a circuit on a semiconductor chip which operates to store digital information. Over the last ten years, the number of bits which can be stored in a single semiconductor memory chip has continuously grown; and present day memory chips store up to 65,536 data bits. Typically, these memory chips are utilized in conjunction with digital logic chips to form a digital computer or special purpose controller.

Now in the prior art, both read-write semiconductor memories and read-only semiconductor memories exist. A read-write memory is one where the stored data bits are not fixed in a predetermined pattern but instead are electrically alterable to any desired pattern. That is, during the memory's operation, any desired data pattern can be written into the memory and read therefrom by the application of appropriate memory control signals.

By comparison, in a read-only memory, the data bits are fixed. That is, the data bits in a read-only memory are written only one time in a predetermined pattern; and thereafter, those data bits can be read from the memory but they cannot be altered by another write operation.

Both the read-write memory and the read-only memory have their own particular advantages and disadvantages. For example, a read-write memory is suitable for use as a "scratch-pad" from which information can be retrieved and sent to an arithmetic unit; and the results can be stored back in the read-write memory. On the other hand, the number of bits that can be stored in a read-write memory is generally less than the number of bits that can be stored in a read-only memory. Further, data in a read-write memory is volatile in that it is destroyed whenever power is inadvertently lost on the chip.

Thus, depending upon the particular application, a digital system will include in its architecture either a read-write memory, or a read-only memory, or both. For example, a digital system might include 64,000 words of read-write memory and 64,000 words of read-only memory.

Consider now a digital system which includes both read-write memory and read-only memory; but the digital system operates such that information from the two memories is never accessed at the same time instant. For example, the read-only memory could contain digital information which is utilized only during a power-on sequence to initialize the rest of the digital system. Then, after this initialization sequence, the read-write memory could be used as a scratch-pad for data which is operated on by an arithmetic unit.

One problem with such a system is that it is undesirably expensive; and another problem is that it is undesirably large in physical size. This is because separate memory chips are provided to perform the read-only and read-write memory functions, even though those two functions are not performed at the same time. Thus to reduce the cost and physical size of the system, it would be highly desirable to provide a single semiconductor memory which in one mode operates as a read-only memory and in another mode operates as a read-write memory.

Accordingly, a primary object of this invention is to provide a semiconductor memory wherein one fixed set of data is stored which can be accessed in a read-only mode, and wherein a variable set of data can also be stored and accessed in read-write mode.

BRIEF SUMMARY OF THE INVENTION

This primary objective and others are accomplished in accordance with the invention by a memory which includes a semiconductor substrate having dopant atoms of a first conductivity type, a plurality of charge storage regions in the substrate, a conductive means over the charge storage regions, dopant atoms of a second conductivity type opposite to the first conductivity type disposed in a subset of the charge storage regions, and a means for selectively applying first and second voltages to the conductive means. With the first voltage applied to the conductive means, the memory operates in a read-only mode where data in the storage regions is fixed and is represented by the presence or absence of the second conductivity type dopant atoms; and with the second voltage applied, the memory operates as a read-write memory where data in the storage regions is variable and is independent of the presence or absence of the second conductivity type dopant atoms.

BRIEF DESCRIPTION OF THE DRAWINGS

Various features and advantages of the invention will best be understood by reference to the following detailed description and accompanying drawings wherein.

DETAILED DESCRIPTION OF THE INVENTION

Figure 1:
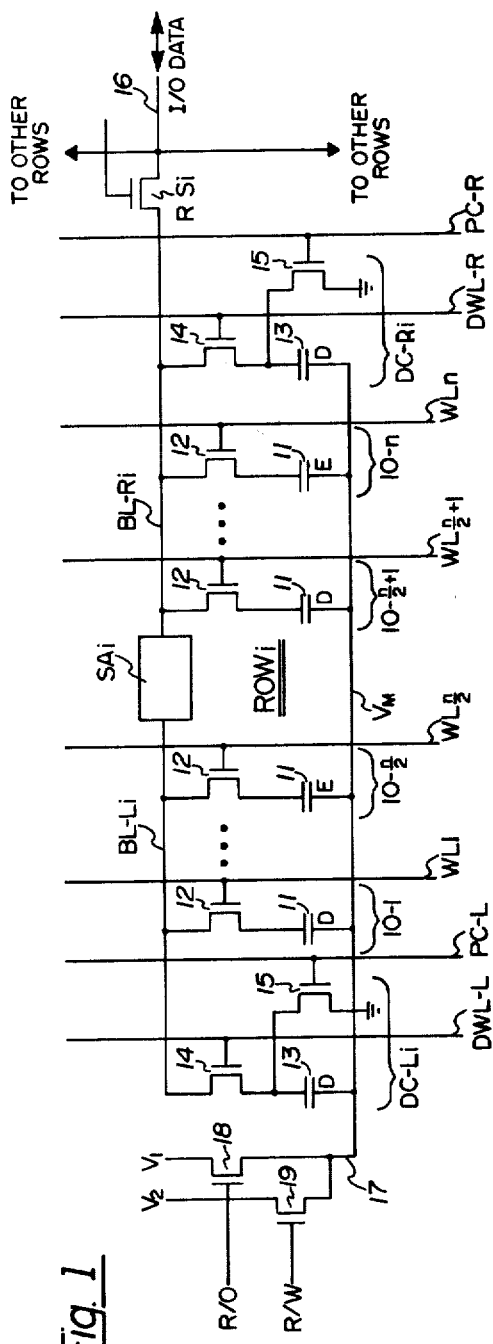
FIG. 1 is a detailed circuit diagram of one preferred embodiment of a memory constructed in accordance with the invention.

Referring now to FIG. 1, there is illustrated a detailed circuit diagram of one preferred embodiment of the invention. This embodiment includes a plurality of memory cells which are arranged in a matrix of rows and columns. Only the ith row of the memory cells is illustrated in FIG. 1 since the other rows are similarly arranged.

Each row includes a total of n memory cells, where n is any even integer. And included in each individual memory cell is a charge storage region 11 and a MOSFET transistor 12. In operation, digital information is stored in the charge storage regions; and that information is selectively accessed by turning-on one of the transistors 12.

To selectively turn-on a transistor 12, there is provided a plurality of column select lines or word lines WLl through WLn. These word lines are connected to the gates of the transistors 12 as illustrated. Also, the drain of the transistors 12 in each row is connected to a pair of bit lines BL-Li and BL-Ri as illustrated. Bit line BL-Li is the left bit line in the ith row; and bit line BL-Ri is the right bit line in the ith row.

Bit lines BL-Li and BL-Ri connect to a sense amplifier SAi. In operation, the sense amplifier functions to sense the charge which is selectively transferred from one of the charge storage regions 11 through one of the transistors 12 to the corresponding bit line. Also to aid in this sensing operation, a pair of dummy cells DC-Li and DC-Ri are included in each row.

Each dummy cell consists of a charge storage region 13 and a pair of transistors 14 and 15. Charge storage region 13 is constructed similar to charge storage region 11, except that it has only half the area and thus half the storage capacity. Transistors 14 are similar to transistors 12 in that they operate in response to signals on dummy word line DWL-L and DWL-R to transfer charge from the dummy storage regions 13 to the bit lines. Transistors 15 operate in response to signals on precharge lines PC-L and PC-R to write zero volts into the dummy cells prior to a sensing operation.

After the dummy cells are charged, a signal is selectively applied to one word line on either the right half or the left half of the row to read charge from one of the charge storage regions 11; and simultaneously, a signal is applied to the dummy word line which lies on the opposite side of the row. For example, to read charge from memory cell 10-1, signals are applied to word line WLl and to dummy word line DWL-R. Sense amplifier SAi then operates to sense and amplify any imbalance of charge on the bit lines to which it is connected. And after these operations are complete, a signal is selectively applied to a row select transistor in the ith row, RSi, in order to transfer information from ROW i to a single I/O data bus 16.

Now in the present invention, charge in the charge storage regions 11 is selectively read in either a read-only mode, or in a read-write mode. And depending upon the mode of operation, two entirely different sets of charge will be read from the memory cells. When the cells are read in a read-write mode, the sensed charge is representative of variable binary data which can be charged as desired via a write operation. During this write operation, data on I/O data line 16 is selectively transferred into one of the memory cells in ROW i by passing that data through row select tansistor RSi, through sense amplifier SAi, and through one of the cell select transistors 12. Conversely, when the cells are read in a read-only mode, the sensed charge is representative of fixed binary data that cannot be destroyed by writing into the memory cells.

Stated another way, suppose for example that the memory of FIG. 1 contains a total of 65,536 memory cells. Then in a read-only mode of operation, 65,536 bits of data could be read from that memory; and the logical one or logical zero value of each of those data bits would be fixed in some predetermined fashion. But in the read-write mode of operation, those same memory cells could store 65,536 variable bits of data. And this variable data is stored in the same charge storage regions 11 as the fixed data; but it does not destroy the fixed data. Thus, in the 65,536 charge storage regions 11, a total of 131,072 bits of data is stored.

This capability is achieved in part by doping one subset of the charge storage regions 11 with depletion-type dopant atoms, and by doping the remainder of the charge storage regions 11 with enhancement-type dopant atoms. By enhancement-type dopant atoms is herein meant atoms of the same conductivity type as the semiconductor substrate in which the memory is fabricated; and by depletion-type dopant atoms is herein meant atoms of an opposite conductivity type as a substrate. In FIG. 1, the letters D and E respectively indicate those charge storage regions having depletion-type and enhancement-type dopant atoms.

Note that the particular subset of charge storage regions 11 which is illustrated in FIG. 1 as having depletion-type dopant atoms is only an example. That is, any particular charge storage region 11 may have either depletion-type or enhancement-type dopant atoms. And those charge storage regions which have depletion-type dopant atoms will, in the read-only mode of operation, store a logical one; whereas those charge storage regions having enhancement-type dopant atoms will in the read-only mode of operation store a logical zero.

Further to achieve the above-described capability, depletion-type dopant atoms are always included in the charge storage regions 13 of the two dummy cells. In addition, the FIG. 1 memory includes a circuit for selectively varying the electric field over all of the charge storage regions. This circuit includes a conductor 17 which lies above all of the charge storage regions 11 and 13, and a pair of transistors 18 and 19.

Transistor 18 receives a logic signal R/O on its gate which, when it is true, causes transistor 18 to conduct and apply a first mode voltage $V_M = V_1$ to conductor 17. Transistor 19 receives a logic signal R/W on its gate which, when true, causes it to conduct and apply a second mode voltage $V_M = V_2$ on conductor 17. Voltage $V_2$ is substantially larger than voltage $V_1$, such as five volts and zero volts respectively. When voltage $V_1$ is applied to conductor 17, the memory operates in a read-only mode; and when voltage $V_2$ is applied to conductor 17, the memory operates in a read-write mode.

Figure 2B:
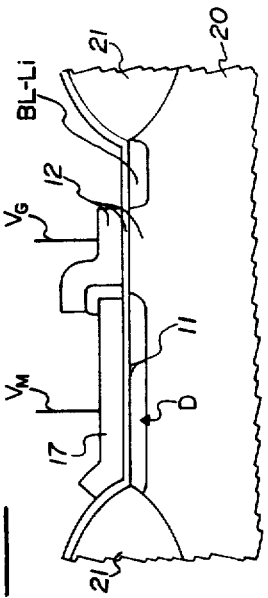
FIGS. 2A and 2B are greatly enlarged cross-sectional views of memory cells in the FIG. 1A embodiment.
Figure 2A:
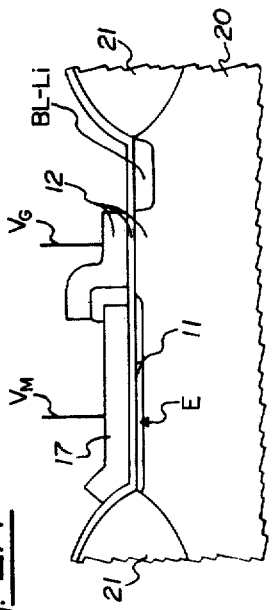

Turning now to FIGS. 2A and 2B, there is illustrated greatly enlarged cross-sectional views of a preferred physical layout for the memory cells and the dummy cells. In these Figures, reference numeral 11 again indicates the transistor which couples the charge storage region to the bit lines BL-Li or BL-Ri; reference numeral 17 indicates the conductor which overlies the charge storage region 11 onto which the mode voltage $V_M$ is selectively applied, reference numeral 20 indicates the semiconductor substrate in which the memory cells are fabricated; and reference numeral 21 indicates a field oxide which defines the perimeter of the cells.

These two physical layouts are identical, except that the cell in FIG. 2A has in its charge storage region 11, enhancement-type dopant atoms; and the cell in FIG. 2B has in its charge storage region 11, depletion-type dopant atoms. Again, the enhancement and depletion-type dopant atoms are respectively indicated by the letters E and D. Preferably, these dopant atoms lie at or within 5000 Å of the substrate surface.

Figure 3:
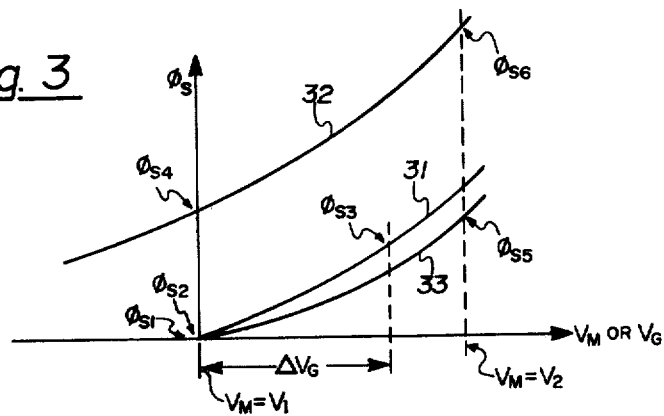
FIG. 3 is a set of curves illustrating the variation of surface potential as a function of mode voltage and gate voltage in the memory cells of FIGS. 2A and 2B.

To understand now how the physical structures of FIGS. 2A and 2B operate to ahieve the above-described functions, attention should be directed to FIGS. 3 and 4. FIG. 3 is a graph having voltages $V_M$ and $V_G$ plotted on the horizontal axis, and having substrate surface potential $\phi_s$ plotted on the vertical axis. Voltages $V_M$ and $V_G$ are with respect to the potential in the bulk of substrate 20.

Three curves 31, 32, and 33 are included in FIG. 3. Curve 31 illustrates how surface potential $\phi_s$ varies under the gate of transistor 12 as a function of gate voltage; curve 32 illustrates how surface potential varies in a charge storage region having depletion-type dopant atoms included in it; and curve 33 illustrates now surface potential varies in a charge storage region having enhancement-type dopant atoms included in it.

Note that if no depletion-type dopant atoms and no enhancement-type dopant atoms were included in a charge storage region, then surface potential in that charge storage region would vary the same as it does in the gate region. Thus, as can be seen in FIG. 3, the effect of including depletion-type dopant atoms in a storage region is to raise the surface potential for a given mode voltage; and the effect of including enhancement-type dopant atoms in a storage region is to lower the surface potential for a given mode voltage.

The exact amount by which the surface potential is raised or lowered in a storage region will depend upon the particular concentration on dopant atoms. And as illustrated in FIG. 3, the concentration of depletion-type dopant atoms preferably is substantially greater than the concentration of enhancement-type dopant atoms. Preferably, the peak doping concentration of the enhancement-type dopant atoms is at least $1 \times 10^{19}$ atoms per $cm^3$. As an example, one preferred peak concentration for the depletion-type and enhancement-type dopant atoms respectively is $1 \times 10^{20}$ A/$cm^3$ and $1 \times 10^{16}$ A/$cm^3$.

Figure 4A:
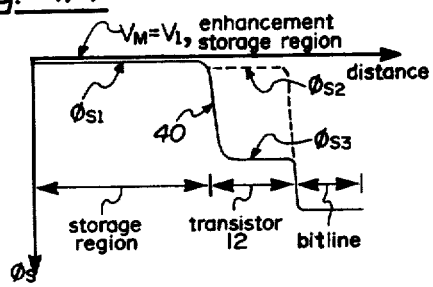
FIGS. 4A through 4D are a set of curves illustrating how the memory cells of FIGS. 2A and 2B operate in both a read-only mode and a read-write mode.
Figure 4B:
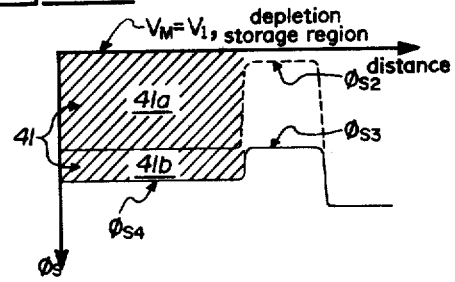
Figure 4C:
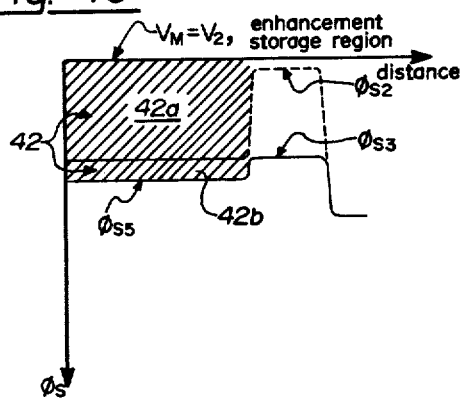

Consider now the surface potentials which are developed in the charge storage regions under four different conditions. These four conditions are illustrated in FIGS. 4A through 4D. In FIG. 4A, the mode voltage on conductor 17 equals $V_1$ (e.g.—a zero volt), and the charge storage region includes enhancement-type dopant atoms. In FIG. 4B, the mode voltage on conductor 17 again equals $V_1$, but the charge storage region includes depletion-type dopant atoms. In FIG. 4C, the mode voltage equals $V_2$ (e.g.—five volts), and the charge storage region includes enhancement-type dopant atoms. And in FIG. 4D, the mode voltage again equals $V_2$, but the charge storage region includes depletion-type dopant atoms.

Under the conditions of FIG. 4A, the surface potential in the charge storage region is fixed at a value $\phi_{s1}$. This value is obtained from curve 33 in FIG. 3; and it is at or near zero volts. Also, the surface potential under the gate region of transistor 12 is at either $\phi_{s2}$ or $\phi_{s3}$. These values are obtained from curve 31 in FIG. 3. Surface potential $\phi_{s2}$ occurs when transistor 12 is turned off, i.e.—it has a low voltage on its gate; and surface potential $\phi_{s3}$ occurs when transistor 12 is turned on, i.e.—it has a high voltage on its gate.

As can be seen from FIG. 4A, surface potential $\phi_{s1}$ in the charge storage region is always less than the surface potential in the gate region of transistor 12. Thus, mobile charges cannot be stored in the charge storage region. In other words, when transistor 12 is turned on, mobile charges cannot flow from the bit line into the charge storage region because the surface potential $\phi_{s1}$ acts as a potential barrier 40 to those charges. Thus, an absence of mobile charges will always be detected by the sense amplifier when an enhancement-type storage region is read in a read-only mode.

By comparison, consider now the operation of a memory cell under the conditions of FIG. 4B. There, the memory is still operating in a read-only mode; but the storage region is a depletion-type storage region. Under these conditions, the surface potential in the charge storage region is $\phi_{s4}$. This is obtained from curve 32 in FIG. 3. And as was the case in FIG. 4A, the surface potential under the gate of transistor 12 again varies between $\phi_{s2}$ and $\phi_{s3}$ depending upon whether transistor 12 is turned on or off.

Thus with transistor 12 turned on, there is no potential barrier to stop mobile charges on the bit line from entering the charge storage region. Consequently, with the transistor 12 turned on, the charge storage region fills up with mobile charges 41; and these mobile charges are trapped in the charge storage region when transistor 12 turns off. Thereafter, during a sensing operation, a portion of the mobile charges 41a will be read from the cell and detected by the sense amplifier. This is to be compared with the operation of the enhancement-type storage region in the read-only mode where the sense amplifier would always detect an absence of mobile charges.

In summary, the operation of the disclosed memory in the read-only mode is as follows. Initially, the mode voltage $V_M$ is set to a relatively low value $V_1$. Thereafter, an attempt is made to write mobile charges into all of the memory cells. But not all the cells can actually be written into. And mobile charges will only be stored in those storage regions which include depletion-type dopant atoms. Subsequently then, the presence or absence of mobile charges in the charge storage regions can be selectively read and sensed by the sense amplifiers. And the presence or absence of these mobile charges will be representative of the presence or absence of the depletion-type dopant atoms—which represents the fixed data in the memory.

Figure 4D:
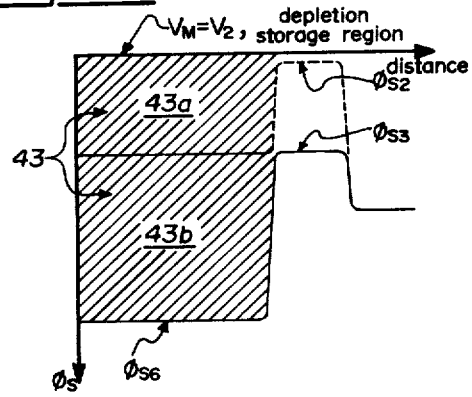

Turning next to FIGS. 4C and 4D, the memory's operation in the read-write mode will be described. In that mode, voltage $V_M$ is set to a relatively high value $V_2$. Under that condition, the surface potential in the enhancement-type storage regions will be $\phi_{s5}$; and the surface potential in the depletion-type storage regions will be $\phi_{s6}$. These values are obtained from curves 33 and 32 in FIG. 3. As before, the surface potential under the gate of transistor 12 will be either $\phi_{s2}$ or $\phi_{s3}$ depending upon whether transistor 12 is turned off or on.

As illustrated in FIG. 4C, surface potential $\phi_{s5}$ is greater than the surface potential $\phi_{s3}$. Thus, mobile charges will be stored in the enhancement-type storage regions in the read-write mode of operation. In fact, the operation of an enhancement-type storage region in a read-write mode is similar to the operation of a depletion-type storage region in a read-only mode.

Thus with transistor 12 turned on in a read-write mode of operation, mobile charges on the bit line are free to pass into an enhancement-type charge storage region; and those charges 42 are trapped when transistor 12 turns off. Subsequently, during a sensing operation, a portion 42a of the trapped mobile charges are sent back onto the bit line where they are sensed by the sense amplifier. Charge portion 42a is identical in magnitude to charge portion 41a. Charge portion 42b remains trapped in the enhancement-type storage region, and portion 42b is different in magnitude than portion 41b. But since the trapped mobile charges 41b and 42b are not sent to the amplifier for sensing, their relative magnitudes is irrelevant to the operation of the memory.

Next as illustrated in FIG. 4D, mobile charges 43 are also stored in the depletion-type storage regions during a read-write mode of operation. And after those charges are stored, a portion 43a of them is sensed by the sense amplifier. During this sensing operation, charge portion 43b remains in the depletion-type storage regions. Portion 43b is substantially greater in size than portions 42b and 41b; but again, the relative magnitude of these trapped mobile charges is irrelevant to the operation of the memory because they are never sent to the sense amplifier. Only the mobile charge portions 41a, 42a, and 43a are sent to the sense amplifier for detection; and the magnitude of those charge portions is identical. That magnitude, as illustrated in FIGS. 4B, 4C and 4D, is determined by the on-surface potential $\phi_{s3}$ under the gate of transistor 12.

A preferred embodiment of the invention has now been described in detail. In addition, many changes and modifications can be made to these details without departing from the nature and spirit of the invention. As one modification, depletion-type dopant atoms are disposed in a subset of the charge storage regions as described above; but no enhancement-type dopant atoms are included in the remaining storage regions. With this modification, the surface potential in the enhancement type storage regions would vary the same as a surface potential in the gate regions of transistor 12; and the operation of the memory would be the same as described with reference to FIGS. 3 and 4, except that in a read-only mode of operation, the surface potential in the enhancement-type storage regions would be $\phi_{s2}$ instead of $\phi_{s1}$. In other words, the height of the barrier 40 to the mobile charges would be somewhat reduced.

Accordingly, since many such changes and modifications may be made to the illustrated preferred embodiment, it is to be understood that the invention is not limited to said embodiment but is defined by the appended claims.

What is claimed is:

1. An improved read-only/read-write semiconductor memory comprising a semiconductor substrate having a body containing dopant atoms of a first conductivity type, a pair of spaced-apart charge storage regions at the surface of said substrate, a bit line at the surface of said substrate spaced apart from said pair of charge storage regions, respective MOSFET transistor gate regions at the surface of said substrate between said bit line and said charge storage regions, and a conductor over said storage regions; the improvement comprising:

dopant atoms of a second conductivity type in one of said storage regions, and dopant atoms of said first conductivity type in the other of said storage regions having a greater doping concentration than is in the body of said substrate; and means for applying a read-write mode voltage to said conductor to permit charge to be stored in both of said storage regions, and for applying a read-only mode voltage to said conductor to permit charge to be stored in said one storage region and simultaneously prevent charge from being stored in said other storage region by producing a potential barrier in said other storage region.

2. A memory according to claim 1, wherein said dopant atoms of said first conductivity type are P-type, and said dopant atoms of said second conductivity type are N-type.

3. A memory according to claim 1, wherein said dopant atoms of said first conductivity type are N-type, and said dopant atoms of said second conductivity type are P-type.

4. A memory according to claim 1, wherein the peak doping concentration of said second conductivity type dopant atoms is at least $1 \times 10^{19}$ atoms per cm$^3$.

5. A memory according to claim 1, wherein said means for applying includes first and second transistor means responsive to respective logic signals for selectively applying said voltages to said conductor.

6. A memory according to claim 1, wherein said conductor is a patterned layer of polycrystalline silicon.

* * * * *